(12) United States Patent
Tsukagoshi et al.

(10) Patent No.: US 6,496,049 B2
(45) Date of Patent: Dec. 17, 2002

(54) SEMICONDUCTOR INTEGRATED CIRCUIT HAVING A CURRENT CONTROL FUNCTION

(75) Inventors: Nobuo Tsukagoshi, Kodama (JP); Masatoshi Nakasu, Shibukawa (JP); Atsushi Fujiki, Takasaki (JP); Kazuaki Ohsawa, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/907,620

(22) Filed: Jul. 19, 2001

(65) Prior Publication Data

US 2002/0017941 A1 Feb. 14, 2002

(30) Foreign Application Priority Data

Aug. 1, 2000 (JP) ........................................ 2000-232739

(51) Int. Cl.[7] .................................................. H03K 5/08
(52) U.S. Cl. ........................ 327/322; 327/327; 327/332; 327/108; 327/538
(58) Field of Search .................................. 327/322, 323, 327/328, 332, 376, 377, 387, 389, 427, 540, 541, 73, 103, 83, 108–111, 538, 539, 543, 545, 546; 323/313

(56) References Cited

U.S. PATENT DOCUMENTS 5,422,593 A * 6/1995 Fujihira ...................... 327/561
5,578,960 A * 11/1996 Matsumura et al. ......... 327/535
5,663,667 A * 9/1997 Blum et al. .................. 327/134
5,739,712 A * 4/1998 Fujii .......................... 327/323
5,793,232 A * 8/1998 Gallinari et al. ............. 327/110
5,796,278 A * 8/1998 Osborn et al. ............... 327/108
5,825,234 A * 10/1998 Sung et al. .................. 327/378
5,838,192 A * 11/1998 Bowers et al. .............. 327/541
5,861,771 A * 1/1999 Matsuda et al. ............. 327/540
6,040,735 A * 3/2000 Park et al. ................... 327/541
6,051,933 A * 4/2000 Aiello ..................... 315/209 R
6,091,285 A * 7/2000 Fujiwara ..................... 327/539

* cited by examiner

Primary Examiner—Timothy P. Callahan
Assistant Examiner—Hai L. Nguyen
(74) Attorney, Agent, or Firm—Mattingly, Stanger & Malur, P.C.

(57) ABSTRACT

This semiconductor integrated circuit is constituted by any one of a p-channel MOS transistor and an n-channel MOS transistor, and is connected between the control terminal and the common terminal so as to produce predetermined voltage. The comparing circuit is operated in response to a control voltage applied between the control terminal and the common terminal so as to compare the predetermined reference voltage with the current-detected voltage which is obtained from the current detecting circuit. The gate controlling MOS transistor controls a gate voltage of the power MOS transistor based upon the comparison output of the comparing circuit. Then, all of these structural members are formed on the same semiconductor substrate.

17 Claims, 7 Drawing Sheets

SEMICONDUCTOR INTEGRATED CIRCUIT HAVING A CURRENT CONTROL FUNCTION

BACKGROUND OF THE INVENTION

1. Field of the Invention

The present invention generally relates to a semiconductor integrated circuit. More specifically, the present invention is directed to a technique effectively adaptable to a power MOS transistor having a current control function such as an overcurrent protection. For example, the present invention is directed to such a technique advantageously adaptable to either a power MOS transistor equipped with a composite function or a semiconductor switch having a composite function.

2. Description of the Related Art

Power MOS transistors have been widely used as, for example, power switches interposed between power sources and loads, capable of ON/OFF-controlling currents flowing therethrough. Conventionally, semiconductor integrated circuits have been provided on which such a power MOS transistor is formed on the same semiconductor substrate in combination with current control circuits capable of protecting overcurrents. This type of semiconductor integrated circuit is also referred to as an MOS transistor equipped with a composite function or a semiconductor switch having a composite function. For instance, when this semiconductor integrated circuit is used, both a conventional mechanical contact type switch function and a fuse (or overcurrent breaker) function may be collected into a single element, and also may be replaced by this semiconductor integrated circuit.

In order to provide user-friendly operation of this semiconductor integrated circuit in such a case that, for example, this semiconductor integrated circuit is employed as a replacement component of a conventional mechanical contact type switch, or in order to provide user-friendly operation as a single body of a power MOS transistor, this semiconductor integrated circuit is constructed in such a manner that only limited numbers of external terminals thereof are provided with respect to users. Concretely speaking, this semiconductor integrated circuit owns three terminals as external terminals (user terminals), namely, an output terminal, a control terminal, and a common terminal. When the respective terminals of the semiconductor integrated circuit are defined in correspondence with electrodes of a single body of an MOS transistor, the output terminal corresponds to the drain of this MOS transistor, the common terminal corresponds to the source thereof, and the control terminal corresponds to the gate thereof. A user connects both the output terminal and the common terminal in series to a current supply path between the power supply and the load, and also applies a control voltage between the control terminal and the common terminal, so that the user may turn ON/OFF the above-explained current supply path.

Generally speaking, an overcurrent protection circuit is employed as the current control circuit formed on the above-described semiconductor integrated circuit. As represented in FIG. 11, this overcurrent protection circuit is arranged by a current detecting circuit 10, a reference voltage generating circuit 20, a comparing circuit 30, and a gate control circuit 40. The current detecting circuit 10 converts a load current flowing between an output terminal P1 and a common terminal P3 into a corresponding voltage so as to detect this load current. The reference voltage generating circuit 20 generates a predetermined reference voltage. The comparing circuit 30 compares the current-detecting voltage of the current detecting circuit with the reference voltage. The gate control circuit 40 controls a gate voltage of a power MOS transistor based upon the comparison output of the comparing circuit 30.

In this case, in the above-explained current detecting circuit 10, a voltage dividing resistor element (shunt resistor) is provided in a current supply path of the load current, namely between the output terminal and the common terminal in such a manner that this voltage dividing resistor element is connected in series to a channel of an MOS transistor Q1 so as to convert the above-described load current into the voltage for detection purposes. Then, a current-detecting voltage is obtained from both ends of this voltage dividing resistor element.

As a result, between the output terminal and the common terminal of the above-explained semiconductor integrated circuit, an internal resistance may appear which is obtained by adding an ON-resistance (channel resistance) of the power MOS transistor to the resistance value of the voltage dividing resistor element. However, since this internal resistance may cause a voltage loss in the load current supply circuit, the resistance value of this internal resistance should be made lower as being permitted as possible. Very recently, while ON resistances of power MOS transistors could be reduced on the order of several milli-ohms, a major portion of this internal resistance could occupy the resistance value of the above-described voltage-dividing resistor element. In order that the current control operation such as the overcurrent protection is carried out while this internal resistance is made lower as being permitted as possible, the above-explained reference voltage must be set to a low voltage.

As to the reference voltage generating circuit, for instance, as shown as a reference in FIG. 12, such a circuit using a zener diode Dz is usually employed. Normally, the reference voltage (zener voltage) obtained from the zener diode Dz is higher than, or equal to approximately 6V, and therefore, this zener voltage cannot be directly used as the above-explained reference voltage. As a consequence, as shown in FIG. 12, this zener voltage of the zener diode is subdivided by using resistance elements R11 and R12 so as to obtain a predetermined lower reference voltage. There is one method for using a forward direction voltage of a diode which is lower than a zener voltage. However, since this forward direction voltage is equal to approximately 0.5V to 1V, this forward direction voltage is sub-divided by a resistor in the case that a reference voltage lower than this forward direction voltage is required.

However, the Inventors of the present invention could find out such a fact that the above-described techniques own the below-mentioned problems.

That is, since either the zener voltage of the zener diode or the forward direction voltage of the diode owns the large temperature dependent characteristic, there is such a problem that the stable reference voltage could not be obtained, and this stable reference voltage is required in order to correctly perform the current control operation such as overcurrent protections. This temperature dependent characteristic may be canceled by using, for example, such a temperature compensation realized by a band gap circuit. However, such a temperature compensation method may cause another problem that the band gap circuit becomes complex. However, there is a further serious problem. That is, in the above-described semiconductor integrated circuit equipped with the current control circuit, this semiconductor integrated circuit is made of such a circuit format that the operation voltages of the reference voltage generating circuit and of the comparing circuit may depend upon the control voltage for ON/OFF operations which is applied between the control terminal and the common terminal, the following restriction may exit. That is, the necessary reference voltage must be produced within the range of this control voltage.

In order to realize such a user-friendly operation as either the MOS transistor equipped with the composite function or the semiconductor switch having the composite function, this control voltage could not be obtained such a high voltage. To the contrary, this control voltage should be desirably made lower as being permitted as possible. When these aspects are considered, there is another problem. That is, in the reference voltage generating circuit shown in FIG. 12 using either the zener voltage of the zener diode or the forward direction voltage of the diode, the input voltage Vin required to generate the reference voltage could not be sufficiently obtained.

SUMMARY OF THE INVENTION

The present invention has been made to solve the above-explained problems, and therefore, has an object to provide such a semiconductor integrated circuit having an output terminal, a control terminal, and a common terminal, and capable of performing a current control such an overcurrent protection. That is to say, this semiconductor integrated circuit turns ON/OFF a path between the output terminal and the common terminal by way of a control voltage applied between the control terminal and the common terminal, and also detects such a current flowing through the path between this output terminal and this common terminal. In such a semiconductor integrated circuit, while a voltage loss occurred between the output terminal and the common terminal can be reduced, and further a user-sided apparatus load required to perform ON/OFF control operations can be reduced, the current control operation such as the overcurrent protection can be correctly carried out under stable condition.

The above-described object, other objects, and features of the present invention may become apparent from a detailed description of the specification and the accompanying drawings.

As means capable of solving the above-described problems, typically-used means among the inventive ideas disclosed in the present invention will be given as follows:

A first means is featured by such a semiconductor integrated circuit having an output terminal, a control terminal, and a common terminal, in which any one conductivity type MOS transistors, i.e., any one of p-channel type MOS transistors and n-channel type MOS transistors are formed in an integrated manner, wherein: a power MOS transistor, a current detecting circuit, a reference voltage generating circuit, a comparing circuit, and a gate controlling MOS transistor are formed on the same semiconductor substrate; and wherein: a drain of the power MOS transistor is connected to the output terminal, a gate thereof is connected to the control terminal, and a source thereof is connected to the common terminal; and also the power MOS transistor controls a current supplied between the output terminal and the common terminal in response to a control voltage applied to the control terminal; the current detecting circuit converts the current into a voltage; the reference voltage generating circuit has one pair of MOS transistors which are commonly connected to each other in such a manner that at least gate-to-source threshold voltages are equivalently made different from each other, and drains and gates of the paired MOS transistors become the same potential to each other; while the drains of both the MOS transistors are commonly connected to each other, and also a common junction point thereof is connected via a current limiting circuit to the control terminal, drain currents are supplied from the control terminal to the respective MOS transistors, and a source of the MOS transistor whose gate-to-source threshold voltage is low is connected via an impedance circuit to the common terminal, and further, a source of the MOS transistor whose gate-to-source threshold voltage is high is connected to the common terminal, whereby a reference voltage is produced from both ends of the impedance circuit, while using a difference between the gate-to-source threshold voltages of the both MOS transistors as a parameter; the comparing circuit is operated in response to a control voltage applied between the control terminal and the common terminal so as to compare the reference voltage with the current-detected voltage which is obtained from the current detecting circuit; and the gate controlling MOS transistor controls a gate voltage of the power MOS transistor upon receipt of the comparison output of the comparing circuit.

Since the reference voltage which constitutes an operation reference of a current control operation such as an overcurrent protection can be set to a low voltage under stable condition by employing the above-described first means, a voltage loss occurred between the output terminal and the common terminal can be reduced, and a user-sided apparatus load required for executing ON/OFF operation can be reduced, and furthermore, a current control operation such as an overcurrent protection can be correctly carried out under stable condition.

A second means is featured by that in the first means, the semiconductor integrated circuit includes a current detecting MOS transistor connected to the power MOS transistor in a current mirror manner, for supplying the current in a preselected mirror ratio; and the current detecting circuit converts a mirror current flowing through the current detecting MOS transistor into a voltage corresponding to the mirror current. In accordance with this second means, a load current can be correctly converted into the voltage so as to detect this load current, while the current detecting circuit is not employed between the output terminal and the common terminal.

A third means is featured by that in either the first means or the second means, all of the transistors which are formed on the semiconductor substrate are equal to n-channel MOS transistors. As a result, the semiconductor integrated circuit can be manufactured in a simple manufacturing process and in low cost, as compared with that of a CMOS semiconductor integrated circuit.

A fourth means is featured by that all of the transistors which are formed on the semiconductor substrate are equal to p-channel MOS transistors. Also, in this case, the semiconductor integrated circuit can be manufactured in a simple manufacturing process and in low cost, as compared with that of a CMOS semiconductor integrated circuit.

A fifth means is featured by that in the first means, the comparing circuit contains a latch function capable of self-holding an output state thereof. As a result, the interrupt condition occurred due to the overcurrent can be held until the application of the control voltage is once removed.

A sixth means is featured by that in the first means, a resistance element is series-connected to the gate of the power MOS transistor, and also both the drain and the source of the gate controlling MOS transistor are connected between a gate-sided terminal of the gate series resistance element and the common terminal, whereby a circuit for controlling a gate voltage of the power MOS transistor is formed. As a result, the control operation for controlling the gate voltage of the power MOS transistor can be firmly and simply carried out by receiving the comparison result of the comparing circuit.

A seventh means is featured by that in the first means, the reference voltage which is produced based upon either the gate-to-source threshold voltages of the one pair of the MOS transistors or a difference between the gate-to-source threshold voltages in such a manner that the reference voltage generating circuit generates a preselected reference voltage by receiving an input voltage lower than such a minimum operation voltage of the comparing circuit. As a result, when the control voltage is externally applied, such a sequence operation can be automatically carried out, by which before the comparing circuit commences the operation, the reference voltage control apparatus outputs a predetermined reference voltage.

An eighth means is featured by that in the first means, the current limiting circuit is formed by a polycrystal silicon layer having a high resistance value. As a result, the current limiting circuit can be relatively easily formed.

A ninth means is featured by that in the first means, the power MOS transistor is formed by employing a polycrystal silicon gate. As a result, the semiconductor integrated circuit can be manufactured without changing the manufacturing process of the known MOS integrated circuit.

A tenth means is featured by that in the first means, impurity density of channel layers of the paired MOS transistors which constitute the reference voltage generating circuit is made different from each other, whereby different gate-to-source threshold voltages from each other are applied to the paired MOS transistors. As a result, the MOS transistor having the higher precision threshold value can be manufactured.

An 11-th means is featured by that in the first means, ratios of gate widths to channel lengths of the paired MOS transistors which constitute the reference voltage generating circuit are made different from each other, whereby different gate-to-source threshold values are applied to the paired MOS transistors. As a result, the MOS transistors having the different threshold values can be manufactured only by changing the design, not by changing the manufacturing process.

A 12-th means is featured by that in the first means, a resistor is series-connected to the drains of the paired MOS transistors which constitute the reference voltage generating circuit, whereby different gate-to-source threshold values are equivalently applied to the paired MOS transistors. As a result, while the same MOS transistors are employed, such MOS transistors having virtually different threshold voltages can be manufactured.

A 13-th means is featured by that in the first means, a temperature detecting circuit operated in response to a control voltage applied to the control terminal; a latch circuit which inverts an output state thereof so as to self-hold the state in the case that the temperature detecting circuit detects a temperature higher than, or equal to a predetermined temperature; and a gate voltage controlling MOS transistor for controlling the gate voltage of the power MOS transistor upon receipt of the held output of the latch circuit at the gate thereof are formed on the semiconductor substrate. As a result, the interrupt condition which occurs due to abnormal temperature increase can be maintained until the application of the control voltage is once removed.

A 14-th means is featured by that in the first means, in the reference voltage generating circuit, a back gate of one of the MOS transistor whose source is connected via the impedance circuit to the common terminal is connected to the common terminal at the same potential. As a consequence, both the stability characteristic and the reproducibility characteristic of the reference voltage can be improved, while eliminating the adverse influence caused by the stray bipolar transistor within the semiconductor substrate.

A 15-th means is featured by that in the first means, the output terminal is derived from the semiconductor substrate, and the common terminal is derived from an electrode layer on an insulating film which is formed on the power MOS transistor. As a consequence, the respective terminals can be derived in a simple manner.

BRIEF DESCRIPTION OF THE DRAWINGS

For a better understanding of the present invention, reference is made of a detailed description to be read in conjunction with the accompanying drawing, in which.

DESCRIPTION OF THE EMBODIMENTS

Referring now to the accompanying drawing, a description will be made of typical embodiment modes of the present invention involving the above-explained solving means.

Figure 1:
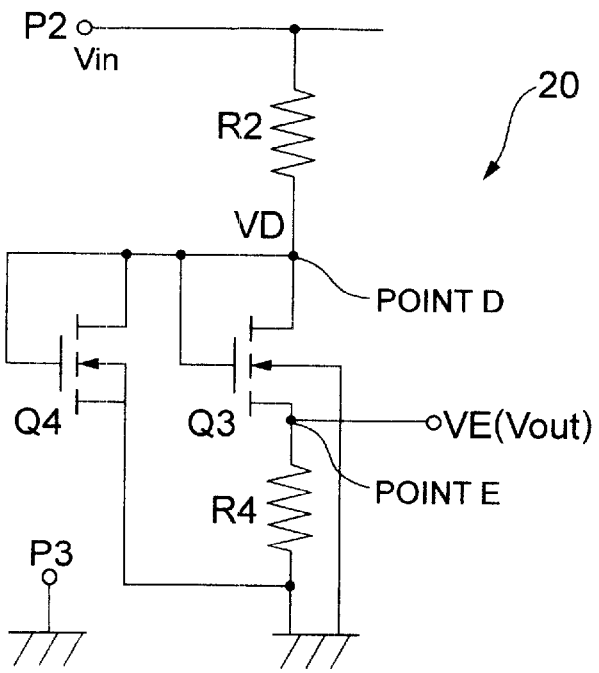
FIG. 1 is a circuit diagram for indicating a reference voltage generating circuit according to an embodiment of the present invention.

FIG. 1 is a diagram for representing a reference voltage generating circuit according to an embodiment mode, which is assembled into a semiconductor integrated circuit of the present invention.

The reference voltage generating circuit 20 shown in this drawing is arranged by one pair of n-channel MOS transistors Q3/Q4, a resistance element R2, and another resistance element (resistive element) R4. One pair of these n-channel MOS transistors Q3 and Q4 are formed in such a manner that these MOS transistors own different gate-to-source threshold voltages from each other. The resistance element R2 constitutes a current limiting circuit. The resistance element R4 constitutes a constant impedance circuit. That is, the above-explained MOS transistors Q3 and Q4 are fabricated in such a manner that a gate-to-source threshold voltage VGS(on)(Q3) of one MOS transistor Q3 is made lower than a gate-to-source threshold voltage VGS(on)(Q4) of the other MOS transistor Q4 by a predetermined voltage value.

These MOS transistors Q3/Q4 are commonly connected in such a manner that the respective drains thereof are shortcircuit-coupled to the respective gates thereof, and further, the drains of both the MOS transistors are set at the same potentials. This common connection point (point D) is connected via the resistance element R2 having the high resistance element (M Ω order) to a control terminal P2. Furthermore, while the source of the transistor Q4 whose gate-to-source threshold voltage is high is directly connected to the common potential equal to a potential at a common terminal P3, the source of the transistor Q3 whose gate-to-source threshold voltage is low is series-connected via the resistor element R4 having a preselected impedance to the common potential.

As to a back gate of an MOS transistor, back gates of both the transistors Q3 and Q4 are connected not to the sources, but to the common potential. Since a source region of an MOS transistor becomes an emitter region of a stray bipolar transistor within a semiconductor substrate in which this MOS transistor is fabricated, a potential is not always stable. In order to avoid this drawback and therefore to obtain a stable gate-to-source threshold voltage under better reproducibility condition, the back gates are desirable connected to the common potential.

When a control voltage Vin is applied between the control terminal P2 and the common terminal P3, drain currents are supplied via the resistance element R2 to the MOS transistors Q3 and Q4. In this case, since both the MOS transistors Q3 and Q4 may be operated as a diode by coupling the respective gates thereof to the drains, a gate-to-source threshold voltage VGS(on)(Q3) and another gate-to-source threshold voltage VGS(on)(Q4) appear between the respective drain-to-source paths of the MOS transistors Q3 an d Q4.

At this time, while the resistance element R4 is interposed between the source of the transistor Q3 and the common potential, the source of the transistor Q4 is directly connected to the common potential, and further, the gate-to-source threshold voltage of the transistor Q4 is higher than the gate-to-source threshold voltage of the transistor Q3 (namely, VGS(on)(Q4)>VGS(on)(Q3). As a result, a gate-to-source threshold voltage VGS(on)(Q4) of the transistor Q4 appears between the commonly-connected drains (point D) of the transistors Q3/Q4 and the common potential. Then, a difference (namely VGS(on)(Q3)–VGS(on)(Q4)) between both the gate-to-source threshold voltages of the transistors Q3 and Q4 appears between the source (point E) of the MOS transistor Q3 and the common potential. At this time, a current capable of producing this potential difference flows through the resistor R4. As a result, such a voltage equivalent to the difference between the gate-to-source threshold voltages may be outputted as a reference voltage "VE" from both ends of the resistance element R4.

The above-described reference voltage VE may be set based upon the gate-to-source threshold voltages of the MOS transistors Q3/Q4, and furthermore, may be applied by the difference tween these gate-to-source threshold voltages. As a result, if a gate-to-source threshold voltage of an MOS transistor can be designed, or can be process-controlled, then even such a low voltage as, e.g., 50 mV to 300 mV can be correctly set in a simple manner. Both an input voltage Vin and a current, which are required to produce this reference voltage VE, may be equal to both a voltage and a current, which may generate such a voltage higher than, or equal to a threshold voltage between a drain and a source of this MOS transistor. As to a voltage, this voltage may be made higher than at least the gate-to-source threshold voltages of the MOS transistors Q3 and Q4. As to a current, this current may be made of a very small input current (drain current) which is supplied via the resistance element R2 having a high resistance value.

Each of the gate-to-source threshold voltages of the MOS transistors Q3/Q4 will more or less contain a variation factor caused by an input voltage (drain voltage) and a temperature. However, the above-described reference voltage generating circuit 20 for generating the reference voltage VE based upon the difference between both the threshold voltages may have such an effect capable of canceling such a variation factor to thereby reduce this variation factor.

As previously explained, in the above-described reference voltage generating circuit 20, even when such a low input voltage (control voltage Vin) and a very small input current (drain current) is employed, such a low reference voltage "VE" as 50 mV to 300 mV can be correctly produced under stable condition.

A gate-to-source threshold voltage of an MOS transistor may be set by a relatively correct manner and under better reproducibility characteristic based upon a ratio of a gate width of this MOS transistor to a channel length thereof, or impurity density of a channel layer. Furthermore, this gate-to-source threshold voltage of the MOS transistor may be equivalently set by employing such a circuit means that a resistor is series-connected to the drain thereof. It is desirable that the resistance element R2 owns such a high resistance value of M Ω order so as to reduce a current. Such a resistance element having the high resistive value may be simply manufactured by a polycrystal silicon layer which is made of a high resistance value by employing low impurity density.

Figure 5:
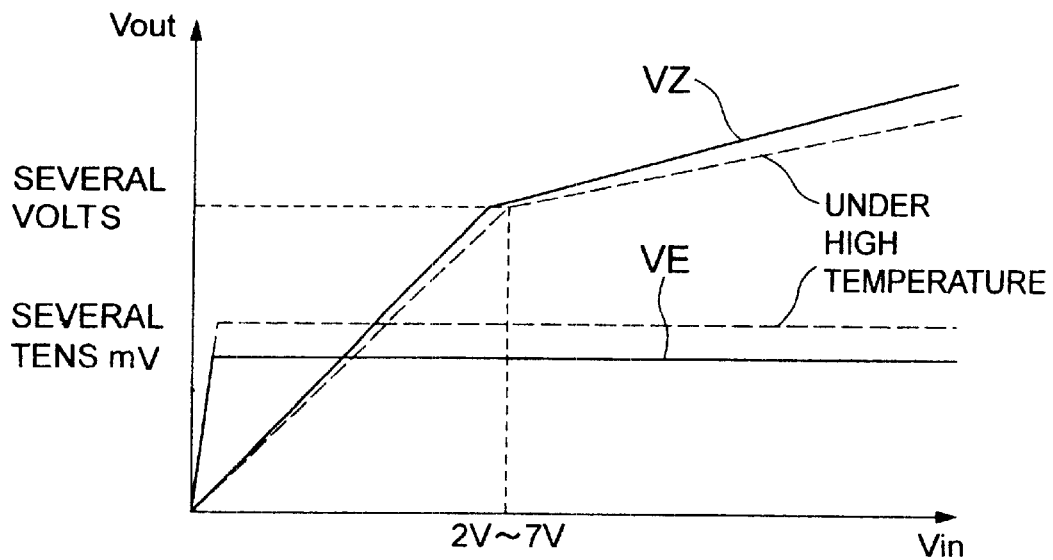
FIG. 5 is a graphic representation for graphically representing compared characteristics between the conventional reference voltage generating circuit and a reference voltage generating circuit according to an embodiment of the present invention.

FIG. 5 graphically represents a variation of an output voltage (Vout) with respect to the input voltage (Vin) of the reference voltage generating circuit shown in FIG. 1. In this drawing, symbol "VZ" shows such a reference voltage produced by utilizing the conventional zener diode, or the conventional forward direction voltage of the diode, whereas symbol "VE" represents a reference voltage which is produced by utilizing a difference between gate-to-source threshold voltages of the MOS transistors according to the present invention. In this drawing, a solid line shows a characteristic obtained under normal use temperature condition, and a broken line represents a characteristic obtained under high temperature (abnormal temperature) condition.

As apparent from this drawing, in the case that such a reference voltage is produced by utilizing either the zener voltage or the forward direction voltage of the diode, higher input voltages (Vin) such as 2V to 7V are required in order to obtain a predetermined reference voltage. Moreover, the resulting reference voltage is high, namely several voltages, and also may be largely varied in response to a change in the input voltages (Vin). To the contrary, in the case that such a reference voltage is produced by utilizing the difference between the gate-to-source threshold voltages of the MOS transistors, such an input voltage required to obtain a predetermined reference voltage is considerably lower than that of the above-explained case. Moreover, the resulting reference voltage may be made lower than the conventional reference voltage, such as several tens mV. In addition, the resulting reference voltage has substantially no variation which is caused by a change in the input voltages (Vin), namely can be produced under substantially stable condition.

As previously explained, the reference voltage generating circuit 20 of the embodiment shown in FIG. 1 may correctly generate such a low reference voltage VE having a stable characteristic in a simple manner even under such a low input voltage and such a small input current. As a consequence, the load give, to the user-sided apparatus for applying the control voltage Vin between the control terminal P2 and the common terminal P3 can be largely reduced, and also this reference voltage generating circuit 20 can perform the current control such as the overcurrent protection, which having the very low voltage loss (low internal resistance), as compared with that of the prior art.

Also, since the conductivity type of the MOS transistors Q3 and Q4 employed in the above-explained reference voltage generating circuit 20 of this embodiment is only n-channel, the following merit may be achieved. That is, this reference voltage generating circuit 20 may be manufactured as a single-handed MOS semiconductor integrated circuit. The manufacturing process of this single-channel MOS semiconductor integrated circuit can be made relatively simpler, and the manufacturing cost thereof is lower than those of a CMOS semiconductor integrated circuit.

Figure 2:
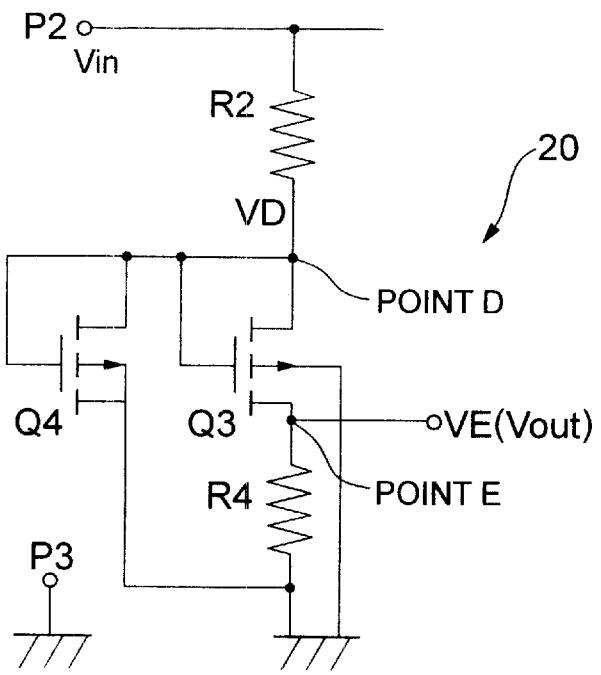
FIG. 2 is a circuit diagram for indicating the reference voltage generating circuit of FIG. 1 constituted by a p-channel MOS transistor, according to the embodiment of the present invention.

FIG. 2 is a circuit diagram for representing that the above-explained reference voltage generating circuit 20 is arranged by employing p-channel MOS transistors Q3 and Q4, according to another embodiment of the present invention. The reference voltage generating circuit 20 shown in this drawing is arranged by merely replacing the conductivity type of the MOS transistors Q3/Q4 shown in FIG. 1, namely "n-channel" is replaced by "p-channel", and therefore, since operations of this reference voltage generating circuit 20 are identical to those of FIG. 1, descriptions thereof are omitted. Also, in this case, the following merit may be achieved. That is, this reference voltage generating circuit 20 may be manufactured as a single-channel MOS semiconductor integrated circuit. The manufacturing process of this single-channel MOS semiconductor integrated circuit can be made relatively simpler, and the manufacturing cost thereof is lower than those of a CMOS semiconductor integrated circuit.

Figure 3:
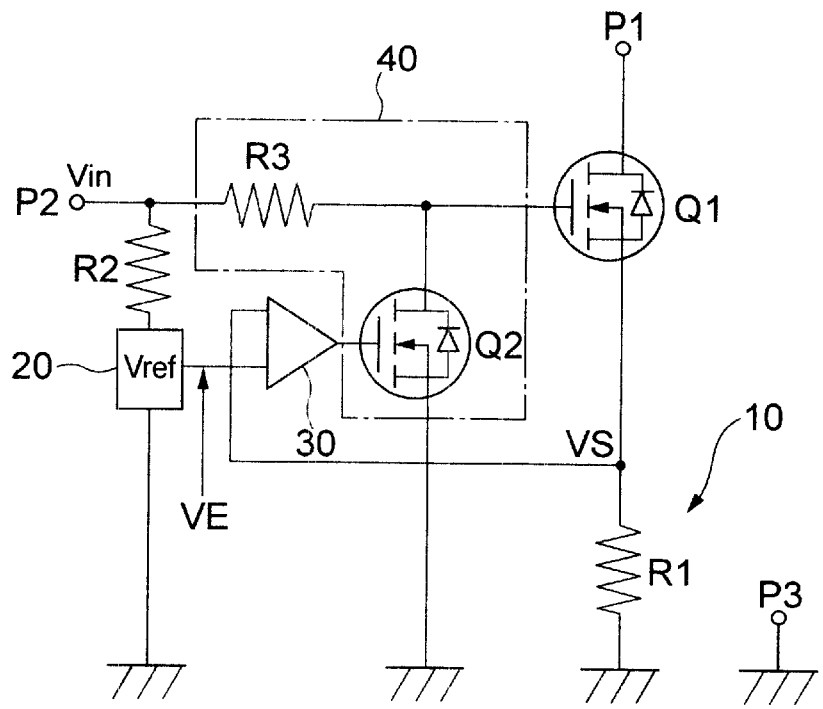
FIG. 3 represents a semiconductor integrated circuit diagram, according to an embodiment, with employment of the reference voltage generating circuit of FIG. 1.

FIG. 3 is a diagram for representing a semiconductor integrated circuit, according to an embodiment mode, to which the reference voltage generating circuit 20 shown in FIG. 1 is applied.

The semiconductor integrated circuit shown in this drawing is provided with a 3-terminal type semiconductor switch and a current limiting circuit. This three-terminal type semiconductor switch having an output terminal P1, a control terminal P2, and a common terminal P with respect to an external circuit. Both an n-channel power MOS transistor Q1 for turning ON/OFF a load current, and such a current limiting circuit capable of protecting this power MOS transistor Q1 are formed on the same semiconductor substrate.

As to this power MOS transistor Q1, the drain thereof is connected to the output terminal P1, the gate thereof is series-connected via a resistance element R3 to the control terminal P2, and the source thereof is series-connected via a shunt resistance element R1 to the common terminal P3.

The current limiting circuit is employed so as to protect both the power MOS transistor Q1 and a external (user-sided) load circuit from an overcurrent. This current limiting circuit is constituted by a current detecting circuit 10 made of a shunt resistance element R1 which constitutes a current detecting element, a reference voltage generating circuit 20, a comparing circuit 30, and a gate control circuit 40 which is made of an n-channel MOS transistor Q2, and a gate series resistance element R3. It should be noted that the reference voltage generating circuit 20 shown in this drawing corresponds to such a circuit portion which is constituted by the MOS transistors Q3/Q4 and the resistor 4 shown in FIG. 1, or FIG. 2.

The shunt resistance element R1 is interposed between a source of the power MOS transistor Q1 and the common terminal P3 in such a manner that this shunt resistance element R1 is series-connected to a channel of this power MOS transistor Q1. The shunt resistance element R1 converts a load current flowing through this power MOS transistor Q1 into a voltage corresponding thereto. While this shunt resistance element R1 is present as an ON resistance between the output terminal P1 and the common terminal P3, this ON resistance may be lowered to such a low resistance having practically no problem by setting another reference voltage "VE" to a low voltage. This reference voltage "VE" is used to judge as to whether or not the load current exceeds a predetermined limited current.

It should also be noted in this example shown in FIG. 3 that the drain current of the power MOS transistor Q1 is directly subdivided by using the resistor R1. Alternatively, in the case that the load current is large, a current detecting MOS transistor may be connected to the power MOS transistor Q1 in a current mirror manner, and further, such a current which is reduced/transferred by this current mirror circuit may be converted into the corresponding voltage.

The comparing circuit 30 is operated in response to a control voltage Vin which is applied from an external user-sided apparatus to a path between the control terminal P2 and the common terminal P3. In such a case that a current-detected voltage VS which is obtained from both ends of the shunt resistance element R1 exceeds the reference voltage VE, this comparing circuit 30 turns ON the gate controlling MOS transistor Q2.

When the gate controlling MOS transistor Q2 is turned ON by the comparing circuit 30, this gate controlling MOS transistor Q2 clamp-controls the gate voltage of the power MOS transistor Q1 to the common potential side. As a result, for example, when a larger current than the allowable current flows through the power MOS transistor Q1 due to shortcircuit of the load, such a feedback control capable of suppressing such a large current is made effective, so that this comparing circuit 30 can protect the power MOS transistor Q1 from the overcurrent. This comparing circuit 30 is manufactured by using the same conductivity type (namely, n-channel) MOS transistor as that of another MOS transistor (not shown) which is formed in the same semiconductor integrated circuit.

A gate series resistance element R3 is provided in order that when the gate controlling MOS transistor Q2 is turned ON, both the operation voltage of the reference voltage generating circuit 20 and the operation voltage of the comparing circuit 30 are not clapping-controlled. The resistance value of this gate series resistance element R3 is set to a large resistance value in such a case that the load of t he user-sided apparatus corresponding to the supply source of the control voltage Vin is especially wan ted to be reduced, whereas the value of the gate series resistance element R3 is set to a small resistance value in such a case that the gate response to the power MOS transistor Q1 is especially wanted to be increased.

Figure 4:
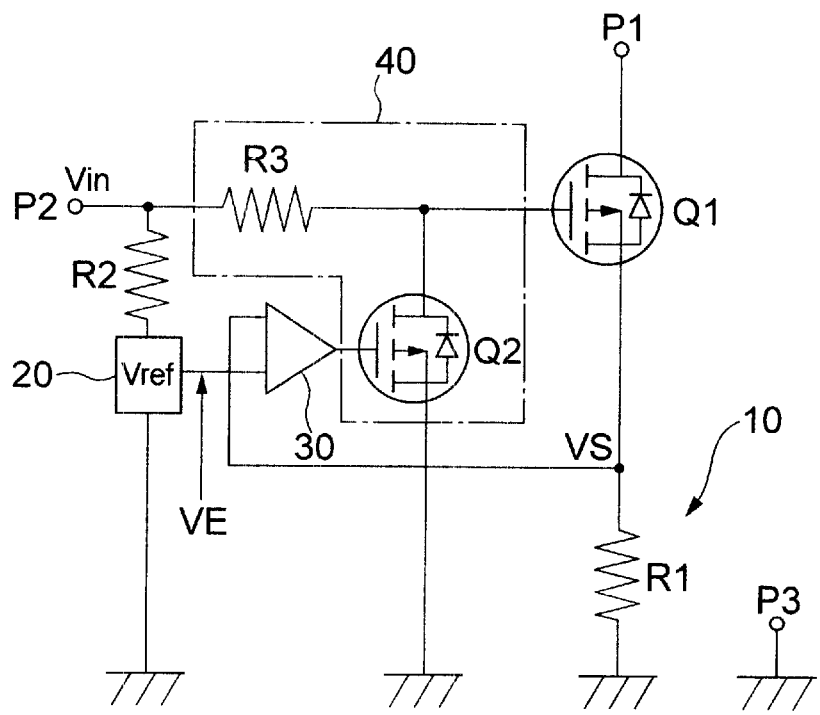
FIG. 4 is a circuit diagram for showing the reference voltage generating circuit of FIG. 3 constituted by a p-channel MOS transistor, according to the embodiment of the present invention.

FIG. 4 is a circuit diagram of a semiconductor integrated circuit, according to another embodiment, in which the circuit shown in FIG. 3 is constituted by p-channel MOS transistors. Since both a basic structure and an operation thereof are similar to those of the above-explained circuit, explanations thereof are omitted.

Figure 6:
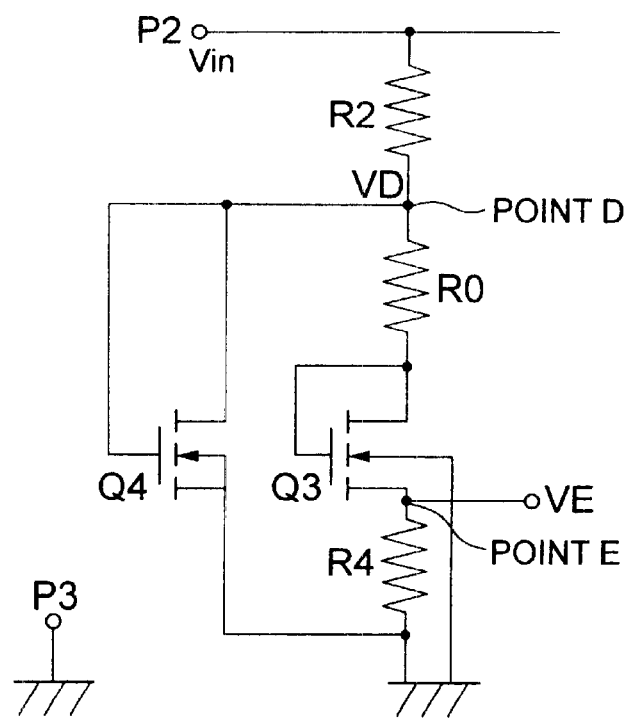
FIG. 6 is a circuit diagram for representing a reference voltage generating circuit according to another embodiment of the present invention.

FIG. 6 represents a reference voltage generating circuit 20 according to another embodiment mode used in the semiconductor integrated circuit of the present invention.

In the reference voltage generating circuit 20 shown in FIG. 6, since a resistance element R0 is series-connected to a drain of one transistor (namely, Q3) of one-paired MOS transistors Q3/Q4, even when both these paired MOS transistors Q3/Q4 are made having the substantially same characteristics, gate-to-source threshold voltages thereof are made different from each other in view of circuit idea. Even when the gate-to-source threshold voltages are made different from each other by employing such a circuit means, a reference voltage may be produced based upon a difference between the gate-to-source threshold values of the two MOS transistors. In this embodiment mode, although the stability of this reference voltage generating circuit 20 with respect to a change in the input voltages (Vin) is slightly deteriorated, the following merit may be achieved. That is, this reference voltage generating circuit 20 need not manufacture these paired MOS transistors Q3/Q4 in such a manner that the characteristic of the MOS transistor Q3 is different from the characteristic of the MOS transistor Q4. As a result, the manufacturing steps can be simplified.

FIG. 17 indicates a concrete circuit of a semiconductor integrated circuit to which the reference voltage generating circuit according to the present invention is applied.

The semiconductor integrated circuit shown in this drawing is manufactured in accordance with an n-channel MOS process with employment of both an n-conductivity type silicon semiconductor substrate and a polycrystal silicon gate.

This semiconductor integrated circuit is constituted as a so-called "power MOS transistor equipped with a composite function", or a so-termed "semiconductor switch equipped with a composite function." In addition to an n-channel power MOS transistor Q1 which constitutes a major structure of this semiconductor integrated circuit, a reference voltage generating circuit 20, a comparing circuit 30, a gate voltage controlling circuit 40, a temperature detecting circuit 60, a latch circuit 50, a gate-voltage-controlling n-channel MOS transistor Q5, a current-detecting n-channel MOS transistor Q6, a current-detecting shunt resistance element R1, and the like are formed in an integrated manner on the same semiconductor substrate. Also, as external elements of this semiconductor integrated circuit, there are provided an output terminal P1 corresponding to a drain terminal, a control terminal P2 corresponding to a gate terminal, and a common terminal P3 corresponding to a source terminal.

The power MOS transistor Q1 is operated as a switch element which is turned ON/OFF between the output terminal P1 and the common terminal P3 in response to a control voltage Vin applied between the control terminal P2 and the common terminal P3. The current-detecting n-channel MOS transistor Q6 is connected to this power MOS transistor Q1 in a current mirror manner. As a result, a predetermined ratio of a current with respect to a load current flowing through the power MOS transistor Q1 will flow this current-detecting MOS transistor Q6. While the shunt resistance element R1 is series-connected to the source of this MOS transistor Q6, a voltage corresponding to the above-described load current is subdivided to produce a subdivided voltage. This subdivided voltage is applied as the current-detected voltage VS to the comparing circuit 30 so as to be compared.

As previously explained, the reference voltage generating circuit 20 produces a reference voltage "VE" having a low voltage (e.g., several tens mV) by utilizing a difference "VE" between the two gate-to-source threshold voltages of the n-channel MOS transistors Q3 and Q4. This reference voltage VE is entered into the comparing circuit 30 as a comparing reference voltage.

The comparing circuit 30 is constituted by employing one pair of n-channel MOS transistors Q6 and Q7 which constitute a differential pair, and is operated in response to the control voltage Vin which is externally applied between the control terminal P2 and the common terminal P3. When the current-detected voltage VS exceeds the above-described reference voltage VE, this comparing circuit 30 turns ON the gate controlling MOS transistor Q2. When this MOS transistor Q2 is turned ON, the gate voltage of the MOS transistor Q1 is clamped to the common potential side, so that this power MOS transistor Q1 is forcibly brought into an OFF state. As a consequence, both the power MOS transistor Q1 and the external load connected to this semiconductor integrated circuit (namely, user-sided appliance) can be protected from the overcurrent.

The temperature detecting circuit 60 is arranged by employing a diode series Dn, an n-channel MOS transistor Q8, a feedback-purpose n-channel MOS transistor Q9, and the like. The diode series Dn constitutes a temperature detecting element. The n-channel MOS transistor Q8 detects a change in forward direction voltages, which is caused by a temperature of this diode series Dn. The temperature detecting circuit 60 detects an abnormal increase in the semiconductor substrate temperature.

The latch circuit 50 is arranged by one pair of n-channel MOS transistors Q11 and Q12, and a triggering n-channel MOS transistor Q13. This pair of n-channel MOS transistors Q11/Q12 form a bi-stable circuit. The triggering n-channel MOS transistor Q13 inverts a state of this bi-stable circuit in response to a temperature detection signal outputted from the temperature detecting circuit 60. This latch circuit 50 is operated in response to the control voltage Vin which is applied between the control terminal P2 and the common terminal P3, and may execute the following latch operation in combination with the above-explained temperature detecting circuit 60.

In other words, the latch circuit 50 is arranged in such a manner that when the control voltage Vin is applied, such an initial stable condition may be established under which the MOS transistor Q11 is turned OFF and the MOS transistor Q12 is turned ON. In this case, when the temperature of the substrate is increased higher than a preselected temperature, the forward direction voltage of the forward direction diode series Dn is lowered, so that the transistor Q8 is changed from the ON state into the OFF state. As a result, the transistor Q13 is turned ON and the transistor Q12 is forcibly turned OFF, so that the latch circuit may invert the transistor Q11 into the ON state, and also the transistor Q12 into the OFF state. Since this transistor Q12 is turned OFF, the gate current controlling MOS transistor Q5 is turned ON. This MOS transistor Q5 is parallel-connected between the gate of the power MOS transistor Q1 and the common potential in a similar manner to the MOS transistor Q2 which constitutes a gate voltage control circuit 40 in combination with the gate series resistor R3.

As a consequence, since this transistor Q5 is turned ON, the power MOS transistor Q1 is forcibly turned OFF. This control state is also fed back to an MOS transistor Q9 employed in the temperature detecting circuit 60. The MOS transistor Q9 is turned ON by this feedback operation, so that this transistor Q9 bypass-connects a portion of the diode series Dn. As a result, the gate voltage of the transistor Q8 is further decreased, so that the following interrupt condition may be maintained. That is, under interrupt condition, the transistor Q8 is turned OFF, the transistor Q13 is turned ON, the transistor Q11 is turned ON, the transistor Q12 is turned OFF, and then, the transistor Q1 is turned OFF. This interrupt state may be maintained until the application of the control voltage Vin is once removed.

Figure 7:
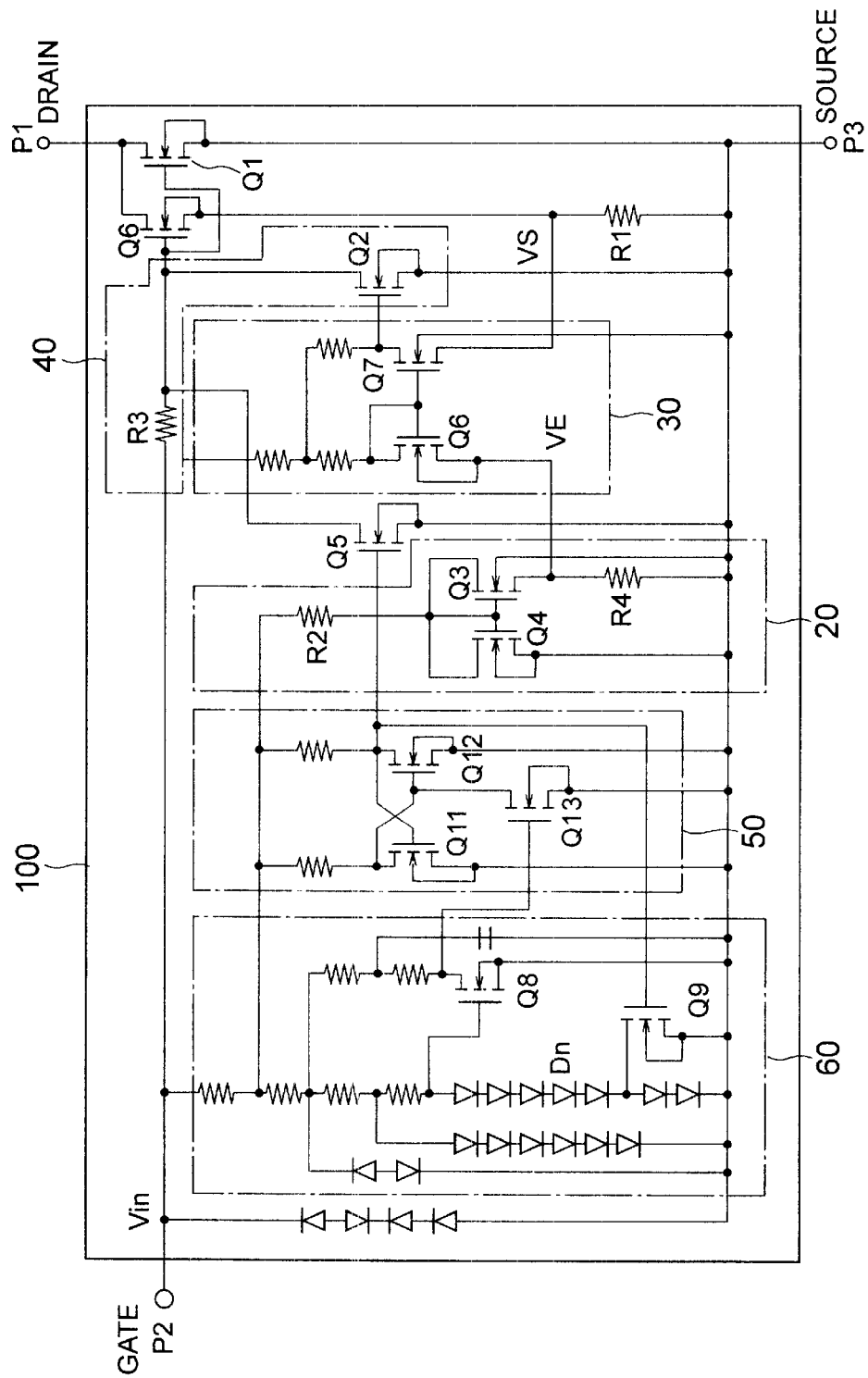
FIG. 7 is a circuit for indicating a semiconductor integrated circuit according to a further embodiment of the present invention.

In the semiconductor integrated circuit of FIG. 7, when the control voltage Vin is externally applied, such an operation is desirably required. That is, before the comparing circuit 30 commences its comparing operation, the reference voltage generating circuit 20 outputs a predetermined reference voltage VE. If so, then the comparing circuit 30 may correctly carry out the comparing operation based upon the predetermined reference voltage at such a time instant when this operation is started up. In order to firmly execute such a sequence operation, the reference voltage generating circuit 20 can generate the preselected reference voltage VE under such a lower input voltage than at least a minimum operation voltage of the comparing circuit 1. To this end, the reference voltage may be set so as to execute this sequential operation, and this reference voltage may be produced by either the gate-to-source threshold voltages of one pair of MOS transistors Q3/Q4 employed in this reference generating circuit 20, or the difference between these gate-to-source threshold voltages.

It should also be noted that in the semiconductor integrated circuit shown in FIG. 7, the latch circuit 50 is provided only on the side of the temperature detecting circuit 60. Alternatively, when a similarly-operable latch circuit is provided also on the side of the comparing circuit 30 for controlling the current, the interrupt condition which occurs due to the overcurrent may be held until the control voltage Vin is once removed.

Figure 8:
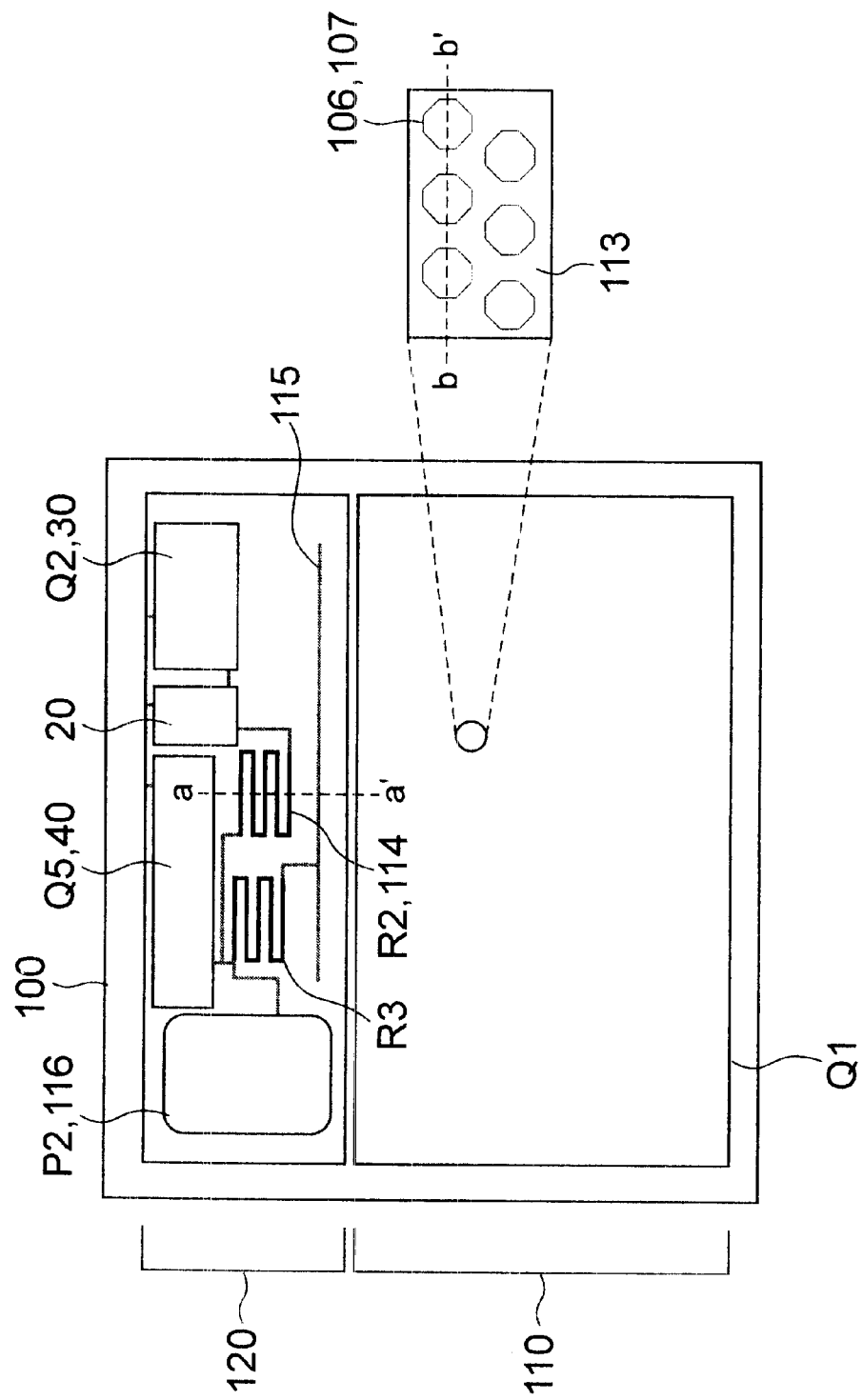
FIG. 8 is a plane layout diagram indicative of an element structural example of the semiconductor integrated circuit according to the embodiment of the present invention.

FIG. 8 is a plane layout diagram for representing an element structure, according to an embodiment, of the semiconductor integrated circuit of the present invention.

The semiconductor integrated circuit shown in this drawing is realized by employing an n-conductivity type silicon semiconductor substrate (semiconductor chip) 100, in which the circuit shown in FIG. 7 is formed. An element forming region on this semiconductor substrate 100 is subdivided into a power region 110 where the power MOS transistor Q1 is formed, and a control region 120 where the reference voltage generating circuit 20 and the like are formed. A major portion of this semiconductor substrate 100 is occupied by the power region 110.

While a portion of the power MOS transistor Q1 is enlarged to be indicated, this power MOS transistor Q1 is formed by employing a polycrystal silicon gate 113 having a mesh-shaped (punched-metal-net shaped) plane layout pattern. In this drawing, reference numeral 114 shows a polycrystal silicon layer used to form a resistance element, and such a resistance element having a resistance value on the order of M Ω is fabricated by way of low impurity density. The above-explained resistance element R2 and the gate series resistor R3 of the reference voltage generating circuit 20 are formed by this polycrystal silicon layer.

The respective circuit units and the respective elements, which are formed on the semiconductor substrate 100, are connected to each other by employing aluminum wiring layer 115. The control terminal P2 is connected to a terminal pad 116 which is formed in the control region 112. Although not shown in this drawing, the output terminal P1 is connected to a rear surface of the semiconductor substrate 100, and the common terminal P3 is connected via an insulating layer formed on the power MOS transistor Q1 to the formed terminal pad 116.

Figure 9:
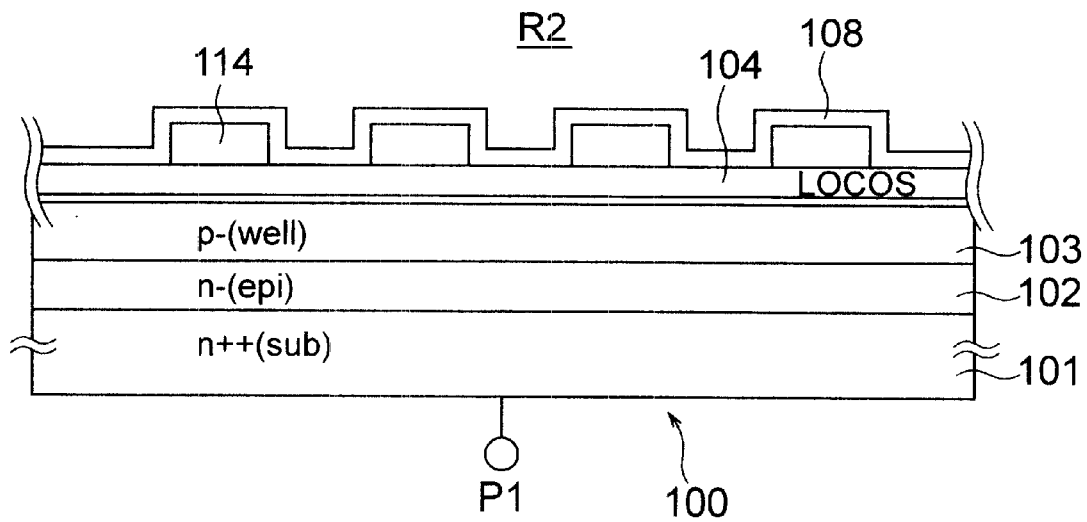
FIG. 9 is a sectional view for schematically indicating the semiconductor integrated circuit, taken along a line "a" to "a'" of FIG. 8.

FIG. 9 schematically shows a sectional structure of a portion (a–a') of the semiconductor substrate 100 shown in FIG. 8, in which the high resistance element R2 is formed. In this drawing, in the semiconductor substrate 100, an $n^-$ conductivity type epitaxial layer 102 into which an n conductivity impurity is doped in low density is formed on an $n^{++}$ conductivity substrate 101 into which an n conductivity impurity is doped in relatively high density. A $p^-$ conductivity type well layer 103 into which a p conductivity impurity is doped is selectively formed on this $n^-$ conductivity epitaxial layer 102. A local oxidation film (LOCOS) 104 is formed on this well layer 103. A $p^-$ conductivity type polycrystal silicon layer 114 which constitutes the above-described high resistance element R2 is formed on this oxidation film 104.

Figure 10:
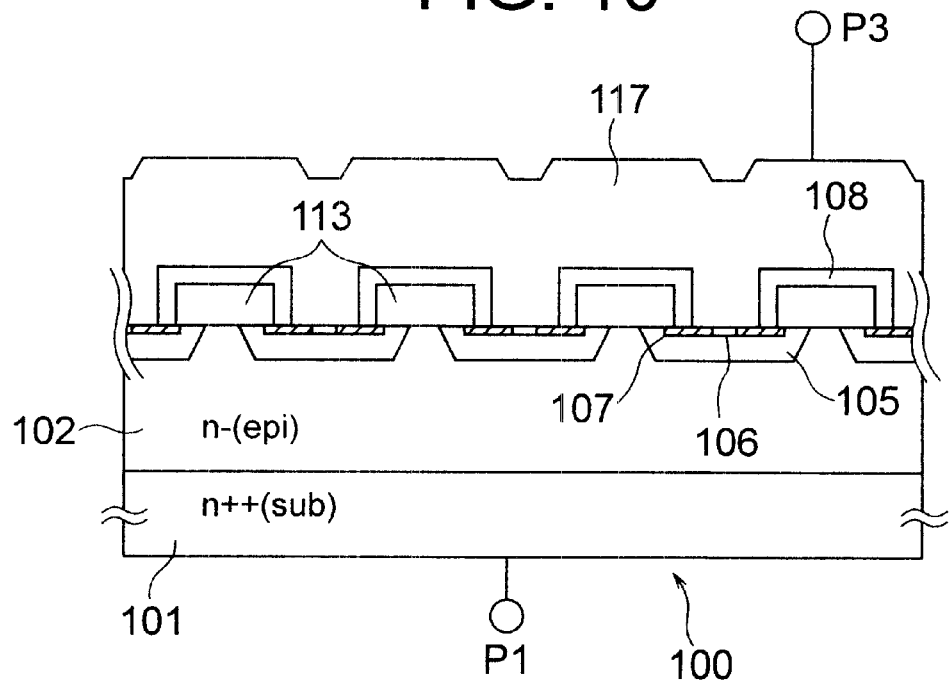
FIG. 10 is a sectional view of schematically showing the semiconductor integrated circuit, taken along a line "b" to "b'" of FIG. 8.
Figure 11:
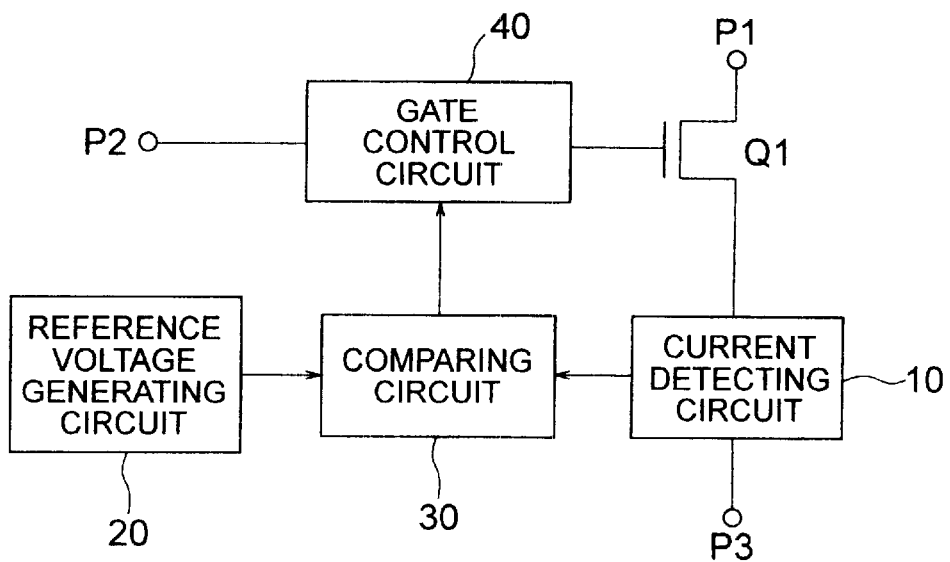
FIG. 11 is a schematic block diagram for representing the arrangement of the power MOS transistor semiconductor integrated circuit equipped with the composite function, which employs the conventional reference voltage generating circuit.
Figure 12:
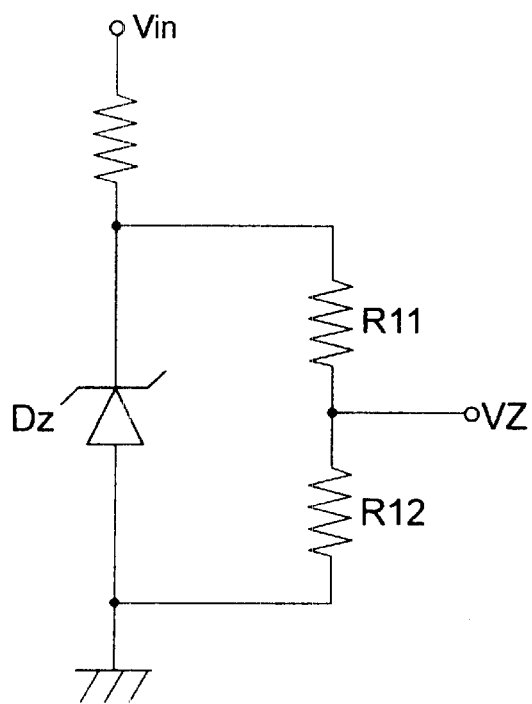
FIG. 12 is a circuit diagram for indicating the structural example of the reference voltage generating circuit used in a semiconductor integrated circuit exemplified as a comparing reference.

FIG. 10 schematically represents a sectional structure of a portion (b–b') where the power MOS transistor Q1 is formed in the semiconductor substrate 100 shown in FIG. 8. As indicated in this drawing, the power MOS transistor Q1 is formed by a p conductivity type channel layer 105, a $p^+$ type contact layer 106, an $n^+$ type source layer 107, and a polycrystal silicon gate 113 having a mesh-shaped plane layout pattern. An insulating oxidation film 108 is formed on the polycrystal silicon gate 113 on which a terminal pad (source electrode) 117 made of an aluminum wiring layer is formed. Then, this terminal pad 117 is connected to the common terminal P3. The $n^{++}$ type semiconductor substrate 100 constitutes a drain electrode, namely such a portion which constructs the output terminal P1, and this portion is directly made in contact with a tab electrode (not shown) which is formed in an integral manner with the output terminal.

It should also be noted that although not shown in FIG. 10, a gate oxidation film is present under the gate 113. Since the transistor having such a structure is known in this technical field, a detailed description thereof is omitted.

While the present invention has been concretely described with reference to the various embodiment modes, the present invention is not limited to these embodiment modes, but may be modified, changed, and substituted without departing from the technical scope and spirit of the present invention. For instance, in accordance with the present invention, the power MOS transistor Q1 may constitute a portion of a gate insulating type bipolar transistor. In other words, the present invention may be similarly applied to an IGBT (Insulated Gate Bipolar Transistor) known in he technical field.

The foregoing description has mainly been made in the case that the various embodiments of the present invention conceived by the Inventors are applied to the semiconductor switches used in the technical background, but the present invention is not limited thereto. For example, the present invention may be applied to such applications that the semiconductor integrated circuit of the present invention is assembled into other semiconductor devices, for example, an LED containing an automatic ON/OFF switch, or a semiconductor laser containing a current control circuit.

As previously described in detail, in accordance with the embodiment of the present invention, in the semiconductor integrated circuit having the output terminal, the control terminal, and the common terminal, this semiconductor integrated circuit turns ON/OFF the path between the output terminal and the common terminal by way of the control voltage applied between the control terminal and the common terminal, and also detects such a current flowing through the path between this output terminal and this common terminal, so that the current control such as the overcurrent protection is carried out. In such a semiconductor integrated circuit, since the reference voltage which constitutes the operation reference of this current control operation is produced by utilizing the difference in the gate-to-source threshold voltages of one pair of MOS transistors, the voltage loss occurred between the output terminal and the common terminal and the common terminal can be reduced, and also, the user-sided apparatus load required to perform ON/OFF control operations can be reduced. Moreover, the current control operation such as the overcurrent protection can be correctly carried out under stable condition.

What is claimed is:

1. A semiconductor integrated circuit having an output terminal, a control terminal, and a common terminal, in which any one of p-channel type MOS transistors and n-channel type MOS transistors are formed in an integrated manner, wherein:
   a power MOS transistor, a current detecting circuit, a reference voltage generating circuit, a comparing circuit, and a gate controlling MOS transistor are formed on the same semiconductor substrate; and wherein:
   a drain of said power MOS transistor is connected to said output terminal, a gate thereof is connected to said control terminal, and a source thereof is connected to said common terminal; and also said power MOS transistor controls a current supplied between said output terminal and said common terminal in response to a control voltage applied to said control terminal;
   said current detecting circuit converts said current into a voltage;
   said reference voltage generating circuit has one pair of MOS transistors which are commonly connected to each other in such a manner that at least gate-to-source threshold voltages are equivalently made different from each other, and drains and gates of said paired MOS transistors become the same potential to each other, while said drains of both said MOS transistors are commonly connected to each other, and also a common junction point thereof is connected via a current supplying circuit to said control terminal, drain currents are supplied from said control terminal to the respective MOS transistors, and a source of said MOS transistor whose gate-to-source threshold voltage is low is connected via an impedance circuit to said common terminal, and further, a source of said MOS transistor whose gate-to-source threshold voltage is high is connected to said common terminal, whereby a reference voltage is produced from both ends of said impedance circuit, while using a difference between said gate-to-source threshold voltages of said both MOS transistors as a parameter;
   said comparing circuit is operated in response to a control voltage applied between said control terminal and said common terminal so as to compare said reference voltage with the current-detected voltage which is obtained from said current detecting circuit; and
   said gate controlling MOS transistor controls a gate voltage of said power MOS transistor upon receipt of the comparison output of said comparing circuit.

2. A semiconductor integrated circuit as claimed in claim 1 wherein:
   said semiconductor integrated circuit includes a current detecting MOS transistor connected to said power MOS transistor in a current mirror manner, for supplying said current in a preselected mirror ratio; and said current detecting circuit converts a mirror current flowing through said current detecting MOS transistor into a voltage corresponding to said mirror current.

3. A semiconductor integrated circuit as claimed in claim 1, wherein:
   all of said transistors which are formed on said semiconductor substrate are n-channel MOS transistors.

4. A semiconductor integrated circuit as claimed in claim 1 wherein:
   all of said transistors which are formed on said semiconductor substrate are p-channel MOS transistors.

5. A semiconductor integrated circuit as claimed in claim 1 wherein:
   said comparing circuit contains a latch function capable of self-holding an output state thereof.

6. A semiconductor integrated circuit as claimed in claim 1 wherein:
   a resistance element is series-connected to the gate of said power MOS transistor, and also both the drain and the source of said gate controlling MOS transistor are connected between a gate-sided terminal of said gate series resistance element and said common terminal, whereby a circuit for controlling a gate voltage of said power MOS transistor is formed.

7. A semiconductor integrated circuit as claimed in claim 1 wherein:
   said reference voltage is produced in such a manner that said reference voltage generating circuit generates a preselected reference voltage by receiving an input voltage lower than a minimum operation voltage of said comparing circuit.

8. A semiconductor integrated circuit as claimed in claim 1 wherein:
   said current supplying circuit is formed by a polycrystal silicon layer having a high resistance value.

9. A semiconductor integrated circuit as claimed in claim 1 wherein:
said power MOS transistor is formed by employing a polycrystal silicon gate.

10. A semiconductor integrated circuit as claimed in claim 1 wherein:
impurity densities of channel layers of said paired MOS transistors which constitute said reference voltage generating circuit are made different from each other, whereby different gate-to-source threshold voltages from each other are applied to said paired MOS transistors.

11. A semiconductor integrated circuit as claimed in claim 1 wherein:
ratios of gate widths to channel lengths of said paired MOS transistors which constitute said reference voltage generating circuit are made different from each other, whereby different gate-to-source threshold values are applied to said paired MOS transistors.

12. A semiconductor integrated circuit as claimed in claim 1 wherein:
a resistor is series-connected to one of the drains of said paired MOS transistors which constitute said reference voltage generating circuit, whereby different gate-to-source threshold values are equivalently applied to said paired MOS transistors.

13. A semiconductor integrated circuit as claimed in claim 1 wherein:
a temperature detecting circuit operated in response to a control voltage applied to said control terminal, a latch circuit which inverts an output state thereof so as to self-hold the state in the case that said temperature detecting circuit detects a temperature higher than or equal to a predetermined temperature, and a gate voltage controlling MOS transistor for controlling the gate voltage of said power MOS transistor upon receipt of the held output of said latch circuit at the gate thereof, are formed on said semiconductor substrate.

14. A semiconductor integrated circuit as claimed in claim 1 wherein:
in said reference voltage generating circuit, a back gate of one of said MOS transistors whose source is connected via the impedance circuit to the common terminal is connected to the common terminal at the same potential.

15. A semiconductor integrated circuit as claimed in claim 1 wherein:
said output terminal is derived from said semiconductor substrate, and said common terminal is derived from an electrode layer on an insulating film which is formed on said power MOS transistor.

16. A semiconductor integrated circuit as claimed in claim 1 wherein:
said MOS transistors are constituted by p-channel conductivity type MOS transistors.

17. A semiconductor integrated circuit as claimed in claim 1 wherein:
said MOS transistors are constituted by n-channel conductivity type MOS transistors.

* * * * *